US011538925B2

(12) United States Patent
Gu et al.

(10) Patent No.: US 11,538,925 B2
(45) Date of Patent: Dec. 27, 2022

(54) ION IMPLANTATION TO FORM STEP-OXIDE TRENCH MOSFET

(71) Applicant: Applied Materials, Inc., Santa Clara, CA (US)

(72) Inventors: Sipeng Gu, Clifton Park, NY (US); Yi Zheng, Sunnyvale, CA (US); Qintao Zhang, Mt Kisco, NY (US); John Hautala, Beverly, MA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/118,711

(22) Filed: Dec. 11, 2020

(65) Prior Publication Data
US 2022/0190141 A1 Jun. 16, 2022

(51) Int. Cl.
*H01L 29/66* (2006.01)
*H01L 29/78* (2006.01)
*H01L 21/265* (2006.01)
*H01L 29/423* (2006.01)

(52) U.S. Cl.
CPC ...... *H01L 29/66734* (2013.01); *H01L 21/265* (2013.01); *H01L 29/4236* (2013.01); *H01L 29/7813* (2013.01)

(58) Field of Classification Search
CPC ......... H01L 21/76237; H01L 29/42336; H01L 29/42352; H01L 29/7397; H01L 29/7831
See application file for complete search history.

(56) References Cited

U.S. PATENT DOCUMENTS

| 6,593,175 | B2* | 7/2003 | Feudel ............. H01L 21/02238 438/152 |
| 7,372,103 | B2 | 5/2008 | Zundel et al. |
| 9,287,376 | B1* | 3/2016 | Laforet ............. H01L 29/66621 |
| 9,299,830 | B1* | 3/2016 | Kawahara ........... H01L 29/4236 |
| 2019/0081147 | A1* | 3/2019 | West ..................... H01L 29/401 |

* cited by examiner

*Primary Examiner* — Fernando L Toledo
*Assistant Examiner* — Valerie N Newton
(74) *Attorney, Agent, or Firm* — KDB Firm PLLC (57) ABSTRACT

Disclosed herein are methods for forming MOSFETs. In some embodiments, a method may include providing a device structure including a plurality of trenches, forming a gate spacer layer over the device structure, and removing the gate spacer layer from a top surface of the device structure and from a first section of each of the plurality of trenches, wherein a portion of the gate spacer layer remains along a second section of each of the plurality of trenches. The method may further include forming a gate oxide layer along the first section of each of the plurality of trenches and along the portion of the gate spacer layer.

20 Claims, 7 Drawing Sheets

ION IMPLANTATION TO FORM STEP-OXIDE TRENCH MOSFET

FIELD OF THE DISCLOSURE

The present embodiments relate to semiconductor device patterning, and more particularly, to MOSFETs with increased bottom oxide thickness.

BACKGROUND OF THE DISCLOSURE

Low voltage power MOSFETs are often used in load switching applications where reduction of the on-resistance ($R_{ds}$) of the device is desirable. In some applications, the $R_{ds}A$ of the device is minimized, where $R_{ds}A$ is the on-resistance of the device multiplied by the active area of the device. Additionally, low voltage power MOSFETs are commonly used in high frequency DC-DC applications.

Trench-based MOSFETs are often used to reduce $R_{dsA}$ of the device. However, as higher-power applications become the norm, and the cell pitch of the MOSFET decreases, cell capacitance also increases. Accordingly, improved trench-based MOSFET approaches are needed to maximize scalability.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one aspect, a method may include providing a device structure including a plurality of trenches, forming a gate spacer layer over the device structure, removing the gate spacer layer from a top surface of the device structure and from a first section of each of the plurality of trenches, wherein a portion of the gate spacer layer remains along a second section of each of the plurality of trenches, and forming a gate oxide layer along the first section of each of the plurality of trenches and along the portion of the gate spacer layer.

In another aspect, a method of forming a MOSFET device may include providing a device structure including a plurality of trenches, forming a gate spacer layer over the device structure including within the plurality of trenches, and etching the device structure to remove the gate spacer layer from a top surface of the device structure and from an upper section of each of the plurality of trenches, wherein a portion of the gate spacer layer remains along a lower section of each of the plurality of trenches. The method may further include forming a gate oxide layer along the upper section of each of the plurality of trenches and along the portion of the gate spacer layer, and forming a gate material over the gate oxide layer.

In yet another aspect, a method of forming a semiconductor device may include forming a gate spacer layer within a plurality of trenches of a device structure and removing the gate spacer layer from an upper section of each of the plurality of trenches, wherein a portion of the gate spacer layer remains along a lower section of each of the plurality of trenches. The method may further include forming a gate oxide layer along the upper section of each of the plurality of trenches and along the portion of the gate spacer layer, and forming a gate material over the gate oxide layer.

BRIEF DESCRIPTION OF THE DRAWINGS

The accompanying drawings illustrate exemplary approaches of the disclosure, including the practical application of the principles thereof, as follows.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Methods and devices in accordance with the present disclosure will now be described more fully hereinafter with reference to the accompanying drawings, where various embodiments are shown. The methods and devices may be embodied in many different forms and are not to be construed as being limited to the embodiments set forth herein. Instead, these embodiments are provided so the disclosure will be thorough and complete, and will fully convey the scope of the methods to those skilled in the art.

Embodiments described herein advantageously provide a simplified step-oxide trench formation process for MOSFET power devices. In some embodiments, an ion implantation is performed to a bottom surface of the device trenches to increase oxide growth during a subsequent thermal oxide process. A second oxide layer may then be formed over the ion-treated trench oxide to form a trench bottom oxide that is thicker than at a top of each trench. Unlike prior art approaches, which often leave dummy material residues after a dummy material pull process resulting in a failed subsequent polysilicon fill, embodiments herein offer a simple and robust process flow to form step-oxide structures inside the trenches, regardless of the feature size scaling.

Figure 1:
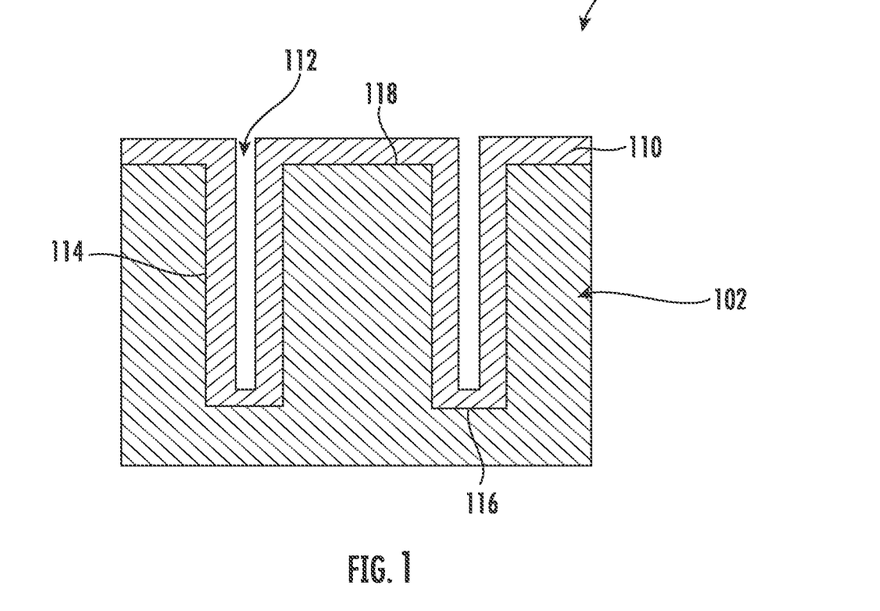
FIG. 1 is a cross-sectional side view of a device structure including a spacer layer, according to embodiments of the present disclosure.

FIG. 1 is a side cross-sectional view of a semiconductor device structure (hereinafter "device") 100, such as a MOSFET, according to one or more embodiments described herein. The device 100 may include a device stack 102 including a plurality of layers and/or features (not shown for the sake of brevity), such as a substrate, an epitaxial layer, a well, a source region or layer, and a plurality of body contacts. Although non-limiting, the epitaxial layer may be a silicon carbide (SiC) n-type drift layer.

As further shown, a plurality of trenches 112 may be formed in the device 100, e.g., using one or more blocking and vertical etch processes. A gate spacer layer 110 may then be formed over the device 100, including within each of the trenches 112. In some embodiments, the gate spacer layer 110 may be a uniform oxide layer or other dielectric layer(s) formed using a conformal oxide process or a dielectric deposition process, such as chemical vapor deposition (CVD), low-pressure CVD (LPCVD), plasma-enhanced CVD (PECVD), or atomic layer deposition (ALD). As shown, the gate spacer layer 110 may be conformally formed along a sidewall 114 and a bottom surface 116 of each trench 112. The gate spacer layer 110 may also be formed along a top surface 118 of the device stack 102.

Figure 2:
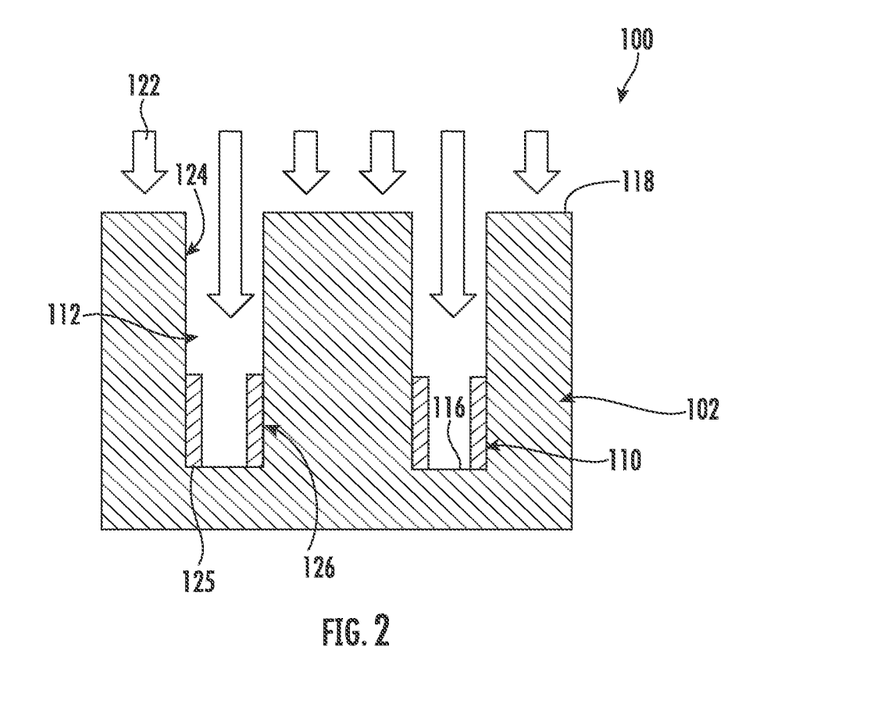
FIG. 2 is a side cross-sectional view illustrating the device following an etch process, according to embodiments of the present disclosure.

In FIG. 2, the gate spacer layer 110 may be partially removed from the device 100 using, e.g., an etch process 122. As shown, the gate spacer layer 110 may be removed from the top surface 118 of the device 100, the bottom surface 116 of each trench 112, and along a first (e.g., upper) section 124 of each trench 112. In some embodiments, a portion 125 of the gate spacer layer 110 remains along a second (e.g., lower) section 126 of each trench 112. In various embodiments, the etch process 122 may include a vertical and/or angled ion etch. For example, the etch process 122 may include one or more vertical etch cycles in which the gate spacer layer 110 is removed from the top surface 118 of the device stack 102 and from the bottom surface 116 of each trench 112. One or more angled ion etch cycles may then be performed to remove the gate spacer layer 110 from the first section 124 of each trench 112. Embodiments herein are not limited in this context.

Figure 3:
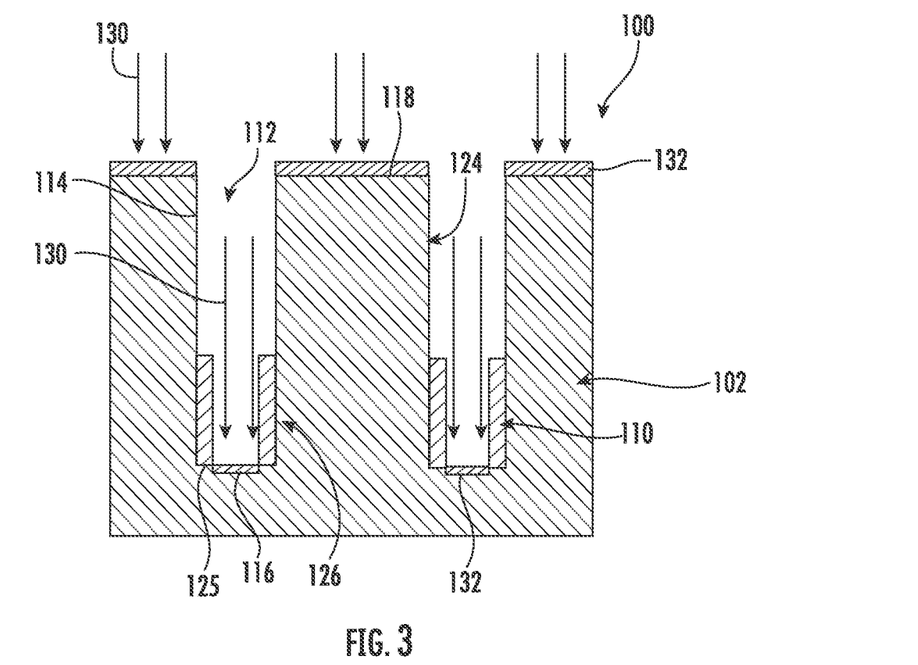
FIG. 3 is a side cross-sectional view illustrating an implantation to the device structure, according to embodiments of the present disclosure.

FIG. 3 demonstrates an ion implant 130 performed to the device 100 to form a treated layer 132 along the bottom surface 116 of each trench 112 and along the top surface 118 of the device stack 102. As shown, the treated layer 132 is not formed along the first section 124 of the trenches 112. In some embodiments, the ion implant 130 may be a beamline implant of silicon carbide delivered at a pre-defined angle, a predefined energy, a predefined dose, etc. In some embodiments, multiple species can be used to increase the oxidation rate. Although non-limiting, the implant angle may be perpendicular, or approximately perpendicular, to a plane defined by the top surface 118 of the device stack 102. For example, the ion implant 130 may impart ions at approximately 0° incidence angle to the sidewall 114 (or approximately 90° relative to the top surface 118 of the device stack 102) to influence subsequent formation of an oxide layer within the trenches 112. The implantation angle may vary in other embodiments, e.g., by +/−15°. By selecting an appropriate angle of delivery, the ion implant 130 may impact just the bottom surface 116 of each trench 112 and the top surface 118 of the device stack 102.

Figure 4:
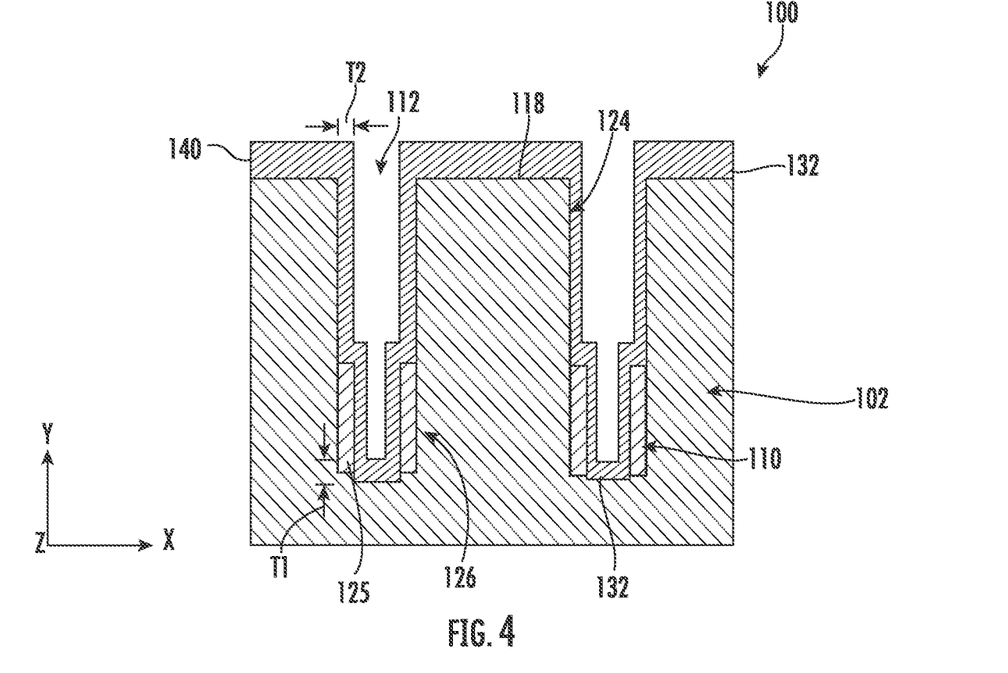
FIG. 4 is a side cross-sectional view illustrating formation of a gate oxide layer over the device structure, according to embodiments of the present disclosure.

FIG. 4 demonstrates formation of a gate oxide layer 140 over the device 100, including within the trenches 112 and along the top surface 118 of the device stack 102. More specifically, the gate oxide layer 140 is formed by a thermal oxidation process to device 100, including to the treated layer 132 and the first section 124 of the trenches 112. The gate oxide layer 140 is also formed over the portion 125 of the gate spacer layer 110. In exemplary embodiments, the gate oxide layer 140 at the bottom of each trench 112 has a first thickness 'T1' (e.g., in the y-direction), while the gate oxide layer 140 along the first section 124 and over the portion 125 of the gate spacer layer 110 has a second thickness 'T2' (e.g., in the x-direction), wherein T1>T2. In some embodiments, the thickness of the gate oxide layer 140 along the top surface 118 of the device stack 102 may be the same as the first thickness. By increasing oxide thickness along the bottom of the trenches 112, critical electrical field and gate charges may advantageously be reduced, while breakdown and off-power may be improved.

Figure 5:
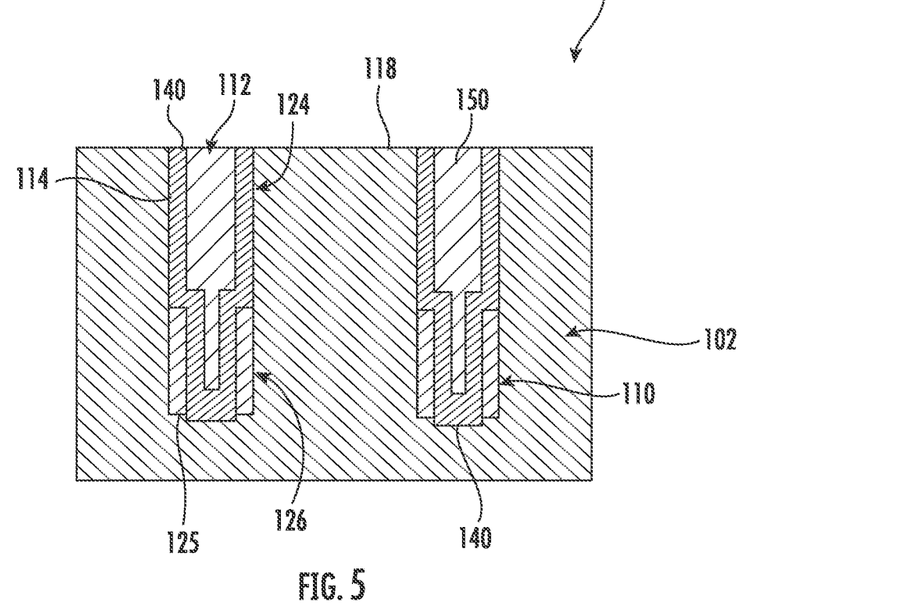
FIG. 5 is a side cross-sectional view illustrating formation of a first gate material, according to embodiments of the present disclosure.

As demonstrated in FIG. 5, the trenches 112 may be filled with a gate material 150. In some embodiments, the gate material 150 may be a polysilicon gate refill deposited over the device 100 and then planarized (e.g., via CMP) or etched back selective to the top surface 118 of the device stack 102. Although non-limiting, in various embodiments, the gate material 150 may be a p-type or n-type polysilicon, which is doped.

Figure 6:
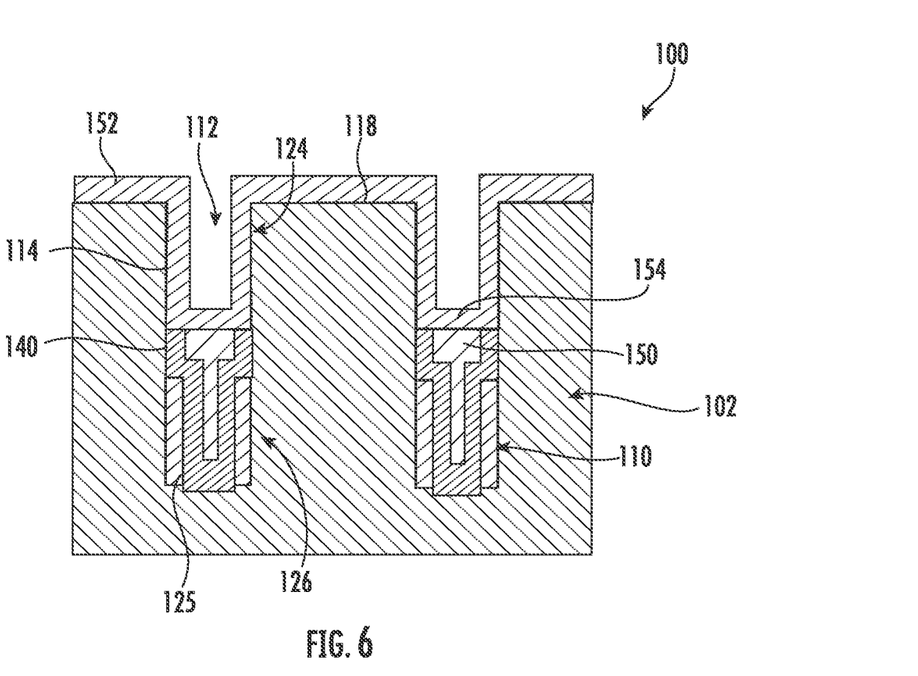
FIG. 6 is a side cross-sectional view illustrating formation of a second gate oxide layer, according to embodiments of the present disclosure.

The gate material 150 and the gate oxide layer 140 may then be partially recessed, as shown in FIG. 6, and a second gate oxide layer 152 is deposited over the device 100, including within the trenches 112 and over the top surface 118 of the device stack 102. The second gate oxide layer 152 is also formed along the first section 124 of each trench sidewall 114. As shown, a gate isolation layer 154 of the second gate oxide layer 152 is in contact with the gate material 150 and a portion of the gate oxide layer 140. In some embodiments, an etch process may be performed to remove the gate material 150 and the gate oxide layer 140 to the depth shown.

Figure 7:
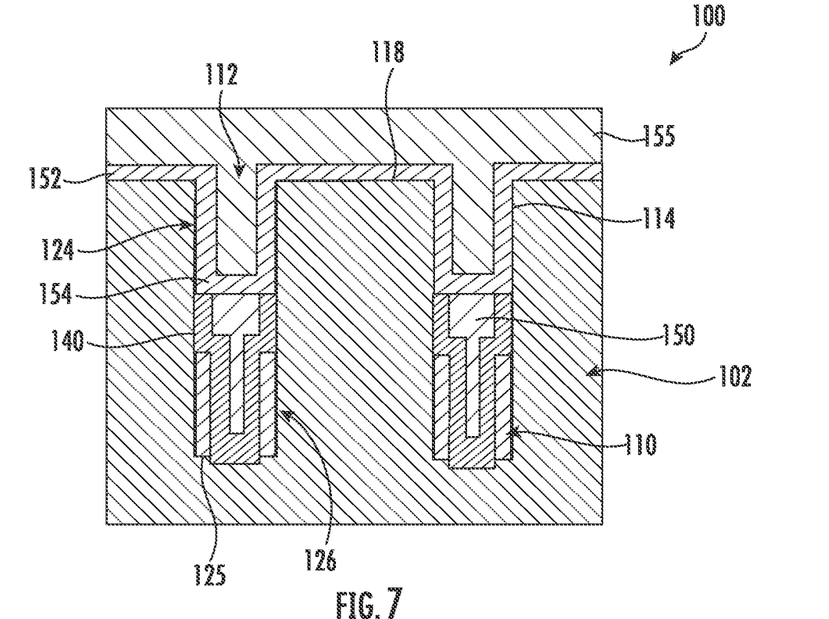
FIGS. 7-8 are side cross-sectional views illustrating formation of a second gate material, according to embodiments of the present disclosure.
Figure 8:
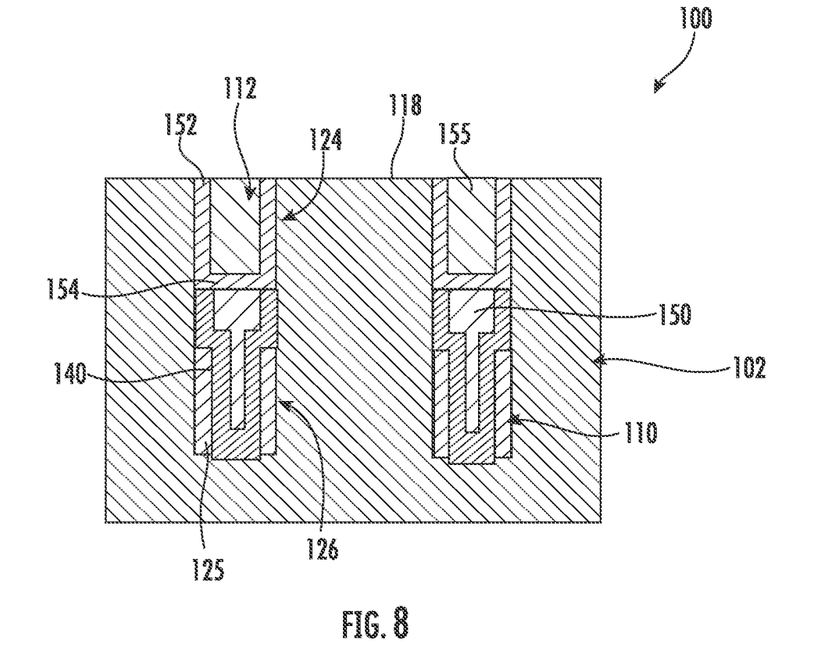

As shown in FIG. 7, a second gate material 155 may then be formed over the device 100, including over the gate isolation layer 154 within each of the trenches 112, to form a set of split gates in the device 100. In some embodiments, the second gate material 155 may be an active n-type polysilicon deposited over the gate isolation layer 154. In some embodiments, the gate material 150 of one or more of the gates is grounded, i.e., connected to a source layer (not shown), while the second gate material 155 is an operational or active gate in which voltage varies from ground to $V_{dd}$. The device 100 may then be planarized or etched to remove a portion of the second gate material 155 and the second gate oxide layer 152, as shown in FIG. 8.

Figure 9:
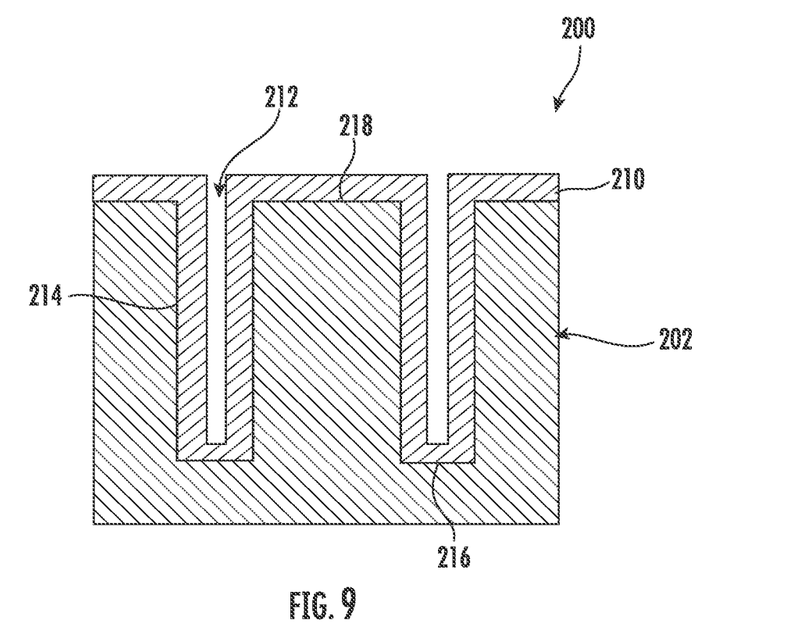
FIG. 9 is a cross-sectional side view of a device structure including a spacer layer, according to embodiments of the present disclosure.

FIG. 9 is a side cross-sectional view of a semiconductor device structure (hereinafter "device") 200, such as a MOSFET, according to one or more embodiments described herein. The device 200 may be similar to the device 100 described herein. As such, only certain aspects of the device 200 may hereinafter be described for the sake of brevity. As shown, a plurality of trenches 212 may be formed in the device 200, and a gate spacer layer 210 may then be formed over the device 200, including within each of the trenches 212. In some embodiments, the gate spacer layer 210 may be a uniform oxide layer or other dielectric layer(s) formed using a conformal oxide process or a dielectric deposition process, such as CVD or PVD. As shown, the gate spacer layer 210 may be conformally formed along a sidewall 214 and a bottom surface 216 of each trench 212. The gate spacer layer 210 may also be formed along a top surface 218 of the device stack 202.

Figure 10:
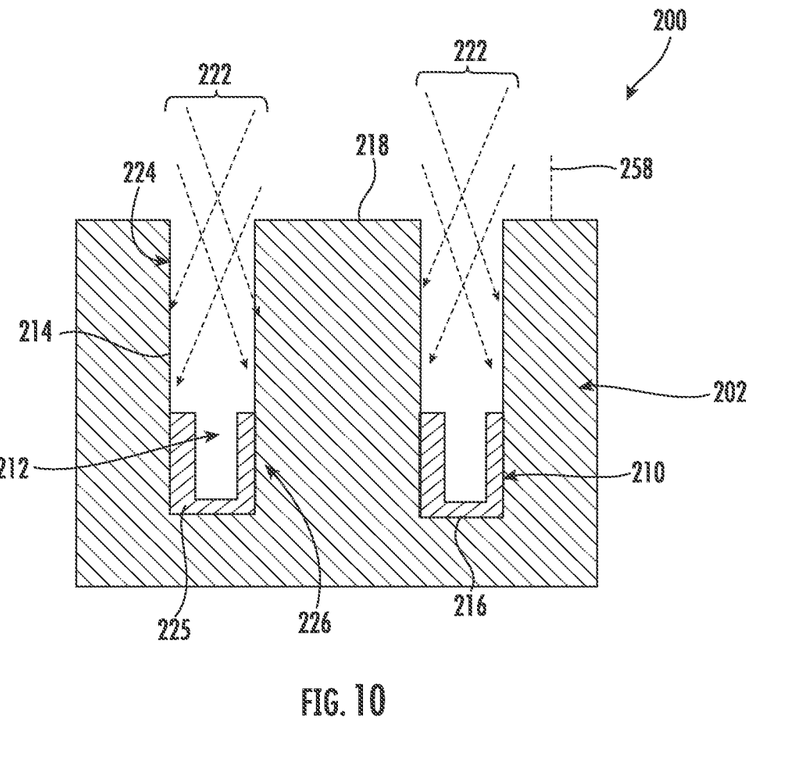
FIG. 10 is a side cross-sectional view illustrating the device following an etch process, according to embodiments of the present disclosure.

In FIG. 10, the gate spacer layer 210 may be partially removed from the device 200 using, e.g., an etch process 222. As shown, the gate spacer layer 210 may be removed from the top surface 218 of the device 200 and from a first (e.g., upper) section 224 of each trench 212. In some embodiments, a portion 225 of the gate spacer layer 210 remains along a second (e.g., lower) section 226 and along the bottom surface 216 of each trench 212. One or more angled ion etch cycles may then be performed to remove the gate spacer layer 210 from the first section 224 of each trench 212 and from the top surface 218 of the device 200. More specifically, the angled ion etch 222 is oriented at a non-zero angle of inclination relative to a perpendicular 258 extending from the top surface 218 of the device stack 202. By selecting an appropriate angle of delivery, the etch process 222 may impact just the first section 224 of each trench 212 without impacting the second section 226.

Figure 11:
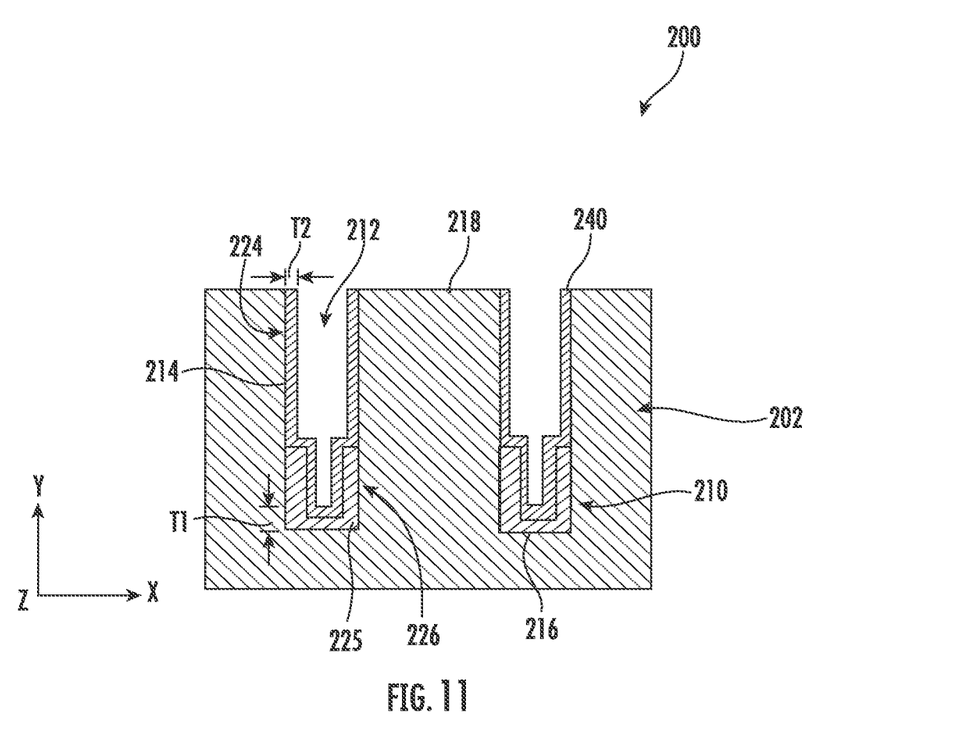
FIG. 11 is a side cross-sectional view illustrating formation of a gate oxide layer over the device structure, according to embodiments of the present disclosure.

FIG. 11 demonstrates formation of a gate oxide layer 240 over the device 200, including within the trenches 212 and over the portion 225 of the gate spacer layer 210. Although not shown, the gate oxide layer 240 may also be formed on the top surface 218 of the device 200. In exemplary embodiments, the gate oxide layer 240 together with the portion 225 of the gate spacer layer 210 along the bottom of the trenches 212 has a first thickness 'T1' (e.g., in the y-direction), while the gate oxide layer 240 along the first section 224 of the trenches 212 has a second thickness 'T2' (e.g., in the x-direction), wherein T1>T2. By increasing oxide thickness along the bottom of the trenches 212, critical electrical field and gate charges may be reduced, while breakdown and off-power may be improved.

Figure 12:
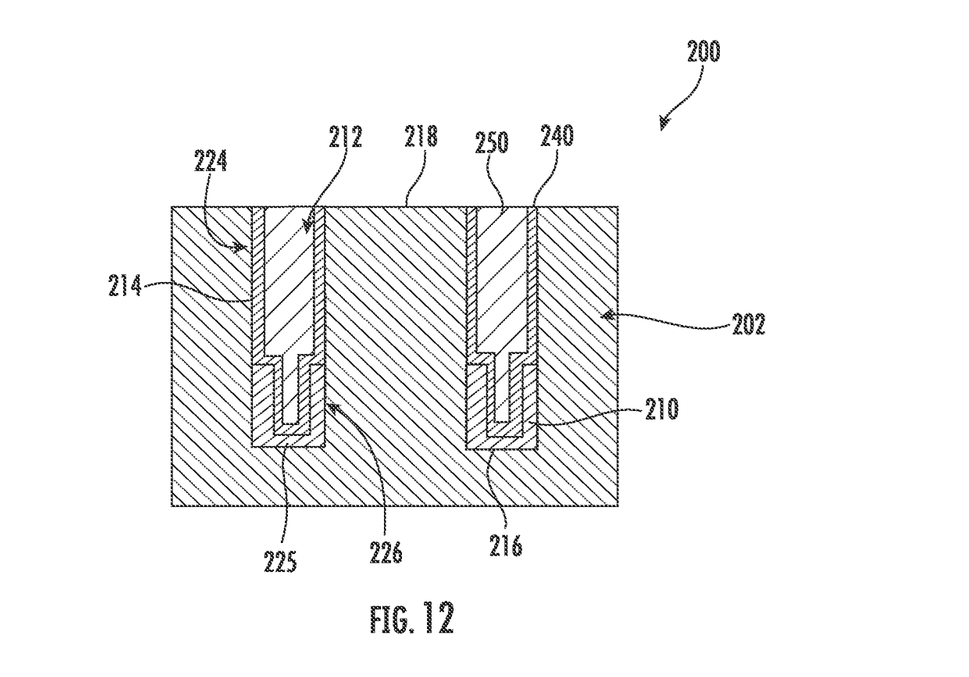
FIG. 12 is a side cross-sectional view illustrating formation of a first gate material, according to embodiments of the present disclosure.

As demonstrated in FIG. 12, the trenches 212 may then be filled with a gate material 250. In some embodiments, the gate material 250 may be a polysilicon gate refill deposited over the device 200 and then planarized (e.g., via CMP) or etched back selective to the top surface 218 of the device stack 202. Although non-limiting, in various embodiments, the gate material 250 may be a p-type or n-type polysilicon, which is doped. Although not shown, the processes performed to/on device 100 shown in FIGS. 6-8 may then be similarly performed to device 200 to form a split gate MOSFET.

In sum, embodiments herein disclose a device and associated process flow for forming a MOSFET. By doping trench bottoms prior to gate material deposition, gate oxidation is increased, which improves overall MOSFET device scaling.

Figure 13:
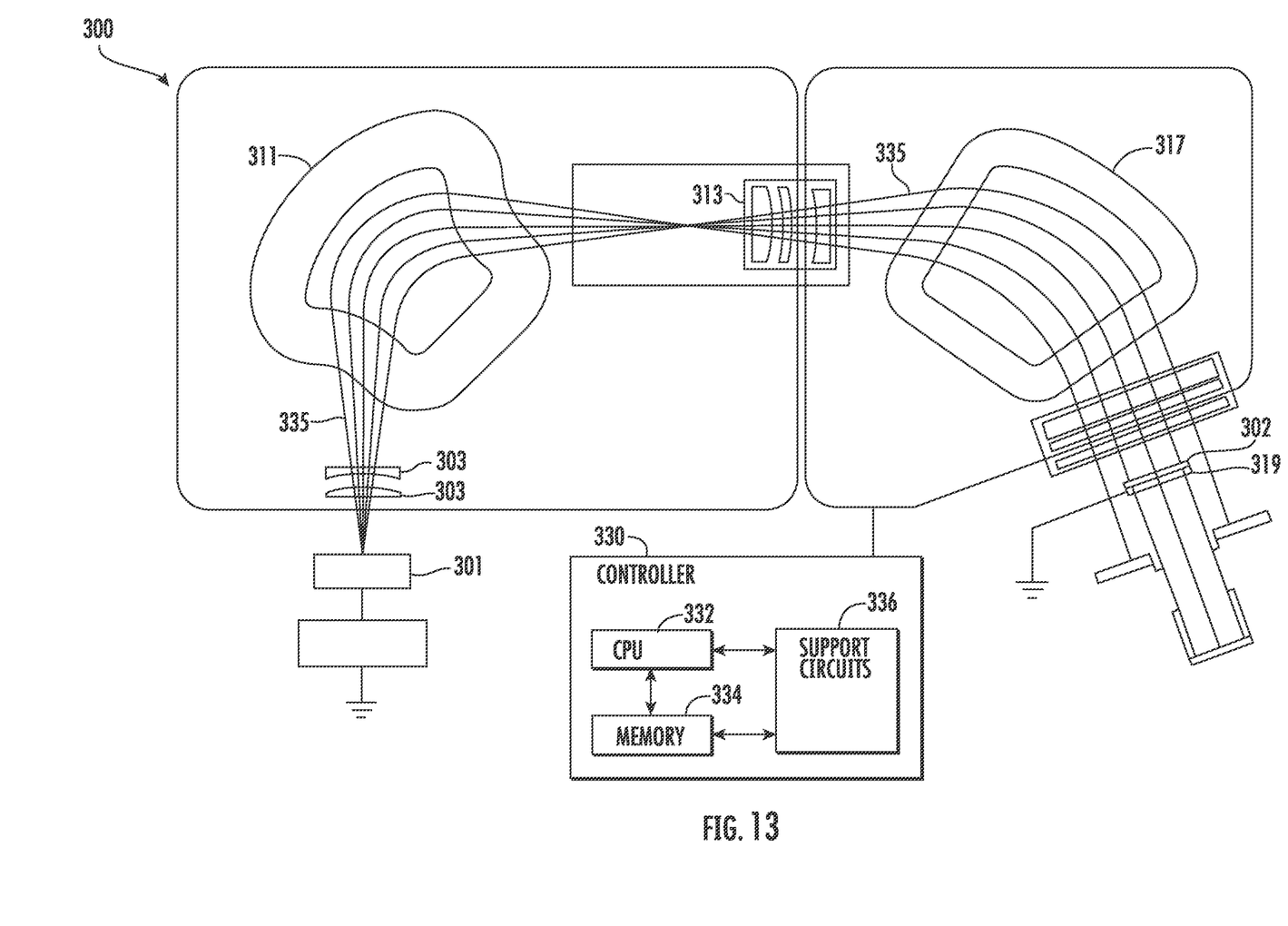
FIG. 13 illustrates a schematic diagram of a processing apparatus according to embodiments of the present disclosure.

FIG. 13 illustrates a schematic diagram of a processing apparatus 300 useful to perform processes described herein. One example of a beam-line ion implantation processing apparatus is the Varian VIISTA® Trident, available from Applied Materials Inc., Santa Clara, Calif. The processing apparatus 300 may include an ion source 301 for generating ions. For example, the ion source 301 may provide an ion implant, such as the ion implant 130 demonstrated in FIG. 3 for forming the treated layers 132 in the device 100. The ion source 301 may also provide an ion etch, such as the etch 122 of FIG. 2 and the etch 222 of FIG. 10. The processing apparatus 300 may also include a series of beam-line components. Examples of beam-line components may include extraction electrodes 303, a magnetic mass analyzer 311, a plurality of lenses 313, and a beam parallelizer 317. The processing apparatus 300 may also include a platen 319 for supporting a substrate 302 to be processed. The substrate 302 may be the same as the device stack 102 and device stack 202 described above from which the device 100 and device 200 are formed, respectively. The substrate 302 may be moved in one or more dimensions (e.g. translate, rotate, tilt, etc.) by a component sometimes referred to as a "roplat" (not shown). It is also contemplated that the processing apparatus 300 may be configured to perform heated implantation processes to provide for improved control of implantation characteristics, such as the ion trajectory and implantation energy utilized to dope the substrate.

In operation, ions of the desired species, for example, dopant ions, are generated and extracted from the ion source 301. Thereafter, the extracted ions 335 travel in a beam-like state along the beam-line components and may be implanted in the substrate 302. Similar to a series of optical lenses that manipulate a light beam, the beam-line components manipulate the extracted ions 335 along the ion beam. In such a manner, the extracted ions 335 are manipulated by the beam-line components while the extracted ions 335 are directed toward the substrate 302. It is contemplated that the apparatus 300 may provide for improved mass selection to implant desired ions while reducing the probability of undesirable ions (impurities) being implanted in the substrate 302.

In some embodiments, the processing apparatus 300 can be controlled by a processor-based system controller such a controller 330. For example, the controller 330 may be configured to control beam-line components and processing parameters associated with beam-line ion implantation processes. The controller 330 may include a programmable central processing unit (CPU) 332 that is operable with a memory 334 and a mass storage device, an input control unit, and a display unit (not shown), such as power supplies, clocks, cache, input/output (I/O) circuits, and the like, coupled to the various components of the processing apparatus 300 to facilitate control of the substrate processing. The controller 330 also includes hardware for monitoring substrate processing through sensors in the processing apparatus 300, including sensors monitoring the substrate position and sensors configured to receive feedback from and control a heating apparatus coupled to the processing apparatus 300. Other sensors that measure system parameters such as substrate temperature and the like, may also provide information to the controller 330.

To facilitate control of the processing apparatus 300 described above, the CPU 332 may be one of any form of general-purpose computer processor that can be used in an industrial setting, such as a programmable logic controller (PLC), for controlling various chambers and sub-processors. The memory 334 is coupled to the CPU 332 and the memory 334 is non-transitory and may be one or more of readily available memory such as random access memory (RAM), read only memory (ROM), floppy disk drive, hard disk, or any other form of digital storage, local or remote. Support circuits 336 may be coupled to the CPU 332 for supporting the processor in a conventional manner. Implantation and other processes are generally stored in the memory 334, typically as a software routine. The software routine may also be stored and/or executed by a second CPU (not shown) that is remotely located from the hardware being controlled by the CPU 332.

The memory 334 is in the form of computer-readable storage media that contains instructions, that when executed by the CPU 332, facilitates the operation of the apparatus 300. The instructions in the memory 334 are in the form of a program product such as a program that implements the method of the present disclosure. The program code may conform to any one of a number of different programming languages. In one example, the disclosure may be implemented as a program product stored on computer-readable storage media for use with a computer system. The program(s) of the program product define functions of the embodiments (including the methods described herein). Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

It is to be understood that the various layers, structures, and regions shown in the accompanying drawings are schematic illustrations. For ease of explanation, one or more layers, structures, and regions of a type commonly used to form semiconductor devices or structures may not be explicitly shown in a given drawing. This does not imply that any layers, structures, and/or regions not explicitly shown are omitted from the actual semiconductor structures.

In various embodiments, design tools can be provided and configured to create the datasets used to pattern the semiconductor layers of the devices 100, 200, e.g., as described herein. For example, data sets can be created to generate photomasks used during lithography operations to pattern the layers for structures as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance running software, or implemented in hardware.

As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading the Detailed Description, the various features and functionality described herein may be implemented in any given application and can be implemented in one or more separate or shared modules in various combinations and permutations. Although various features or elements of functionality may be individually described or claimed as separate modules, one of ordinary skill in the art will understand these features and functionality can be shared among one or more common software and hardware elements.

For the sake of convenience and clarity, terms such as "top," "bottom," "upper," "lower," "vertical," "horizontal," "lateral," and "longitudinal" will be understood as describing the relative placement and orientation of components and their constituent parts as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporating the recited features.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, one of ordinary skill will understand when an element such as a layer, region, or substrate is referred to as being formed on, deposited on, or disposed "on," "over" or "atop" another element, the element can be directly on the other element or intervening elements may also be present. In contrast, when an element is referred to as being "directly on," "directly over" or "directly atop" another element, no intervening elements are present.

As used herein, "depositing" and/or "deposited" may include any now known or later developed techniques appropriate for the material to be deposited including yet not limited to, for example: chemical vapor deposition (CVD), low-pressure CVD (LPCVD), and plasma-enhanced CVD (PECVD). Additional techniques may include semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), and sputtering deposition. Additional techniques may include ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

What is claimed is:

1. A method, comprising:
   providing a device structure including a plurality of trenches;
   forming a gate spacer layer over the device structure;
   removing the gate spacer layer from a top surface of the device structure and selective to a first section of a sidewall of each of the plurality of trenches to expose the sidewall, wherein a portion of the gate spacer layer remains along a second section of the sidewall in a lower section of each of the plurality of trenches;

forming a gate oxide layer along the first section of the sidewall of each of the plurality of trenches and along the portion of the gate spacer layer; and forming a gate material within the lower section of each of the plurality of trenches, wherein the gate spacer layer is removed prior to formation of the gate material.

2. The method of claim 1, wherein forming the gate material comprises forming the gate material over the gate oxide layer within each of the plurality of trenches.

3. The method of claim 2, wherein removing the gate spacer layer further comprises etching the device structure to remove the gate spacer layer from a bottom surface of each of the plurality of trenches.

4. The method of claim 3, further comprising performing an ion implantation to the device structure to form a treated layer along the bottom surface of each of the plurality of trenches and along the top surface of the device structure.

5. The method of claim 4, further comprising thermally oxidizing the device structure to form the gate oxide layer from the treated layer along the bottom surface of each of the plurality of trenches.

6. The method of claim 2, further comprising:
forming a second gate oxide layer along the first section of each of the plurality of trenches; and
forming a second gate material over the second gate oxide layer.

7. The method of claim 6, wherein forming the second gate oxide layer comprises forming a gate isolation layer over the gate material, and wherein the second gate material is formed over the gate isolation layer.

8. The method of claim 1, wherein removing the gate spacer layer comprises performing a vertical ion etch to the gate spacer layer.

9. The method of claim 1, wherein removing the gate spacer layer from the first section of the sidewall of each of the plurality of trenches comprises performing an angled ion etch.

10. The method of claim 9, wherein the angled ion etch is prevented from impacting the first second section of the sidewall of each of the plurality of trenches.

11. A method of forming a MOSFET, comprising:
providing a device structure including a plurality of trenches;
forming a gate spacer layer over the device structure including within the plurality of trenches;
etching the device structure to remove the gate spacer layer selective to a top surface of the device structure and selective to an upper section of a sidewall of each of the plurality of trenches to expose the sidewall, wherein a portion of the gate spacer layer remains along a lower section of each of the plurality of trenches;
forming a gate oxide layer along the upper section of the sidewall of each of the plurality of trenches and along the portion of the gate spacer layer; and
forming a gate material over the gate oxide layer, wherein the gate material is formed within the lower section of each of the plurality of trenches, and wherein the gate spacer layer is removed prior to formation of the gate material.

12. The method of claim 11, wherein etching the device structure further comprises removing the gate spacer layer from a bottom surface of each of the plurality of trenches.

13. The method of claim 12, further comprising:
performing, after the device structure is etched, an ion implantation to the device structure to form a treated layer along the bottom surface of each of the plurality of trenches and along the top surface of the device structure; and
forming the gate oxide layer along the bottom surface of each of the plurality of trenches and along the top surface of the device stack by thermally oxidizing the treated layer.

14. The method of claim 11, further comprising:
forming a second gate oxide layer along the upper section of each of the plurality of trenches; and
forming a second gate material over the second gate oxide layer.

15. The method of claim 14, wherein forming the second gate oxide layer further comprises forming a gate isolation layer over the gate material, and wherein the second gate material is formed directly atop the gate isolation layer.

16. The method of claim 11, wherein etching the device structure comprises:
performing a vertical ion etch; and
performing an angled ion etch to the upper section of the sidewall of each of the plurality of trenches, wherein the angled ion etch is oriented at a non-zero angle of inclination relative to a perpendicular extending from the top surface of the device structure.

17. A method of forming a semiconductor device, comprising:
forming a gate spacer layer within a plurality of trenches of a device structure;
removing the gate spacer layer selective to an upper section of a sidewall of each of the plurality of trenches to expose the sidewall, wherein a portion of the gate spacer layer remains along a lower section of the sidewall in a lower section of each of the plurality of trenches;
forming a gate oxide layer along the upper section of the sidewall of each of the plurality of trenches and along the portion of the gate spacer layer; and
forming a gate material over the gate oxide layer, wherein the gate material is formed within the lower section of each of the plurality of trenches, and wherein the gate spacer layer is removed prior to formation of the gate material.

18. The method of claim 17, further comprising removing the gate spacer layer from a top surface of the device structure, wherein the gate spacer layer is an oxide material.

19. The method of claim 18, further comprising:
performing an ion implantation to the device structure to form a treated layer along a bottom surface of each of the plurality of trenches and along the top surface of the device structure; and
forming the gate oxide layer along the bottom surface of each of the plurality of trenches and along the top surface of the device stack by thermally oxidizing the treated layer.

20. The method of claim 17, further comprising:
forming a gate isolation layer over the gate material; and
forming a second gate material within the plurality of trenches, over the gate isolation layer.

* * * * *